United States Patent
Elkind et al.

(10) Patent No.: US 7,135,680 B2
(45) Date of Patent: Nov. 14, 2006

(54) FOCAL PLANE PROCESSOR FOR IR DETECTION

(75) Inventors: Shimon Elkind, Carmiel (IL); Amnon Adin, Haifa (IL)

(73) Assignee: Semi Conductor Devices (SCD) Partnership, Haifa (IL)

( * ) Notice: Subject to any disclaimer, the term of this patent is extended or adjusted under 35 U.S.C. 154(b) by 164 days.

(21) Appl. No.: 10/511,000

(22) PCT Filed: May 21, 2003

(86) PCT No.: PCT/IL03/00414

§ 371 (c)(1),
(2), (4) Date: Oct. 12, 2004

(87) PCT Pub. No.: WO03/103364

PCT Pub. Date: Dec. 18, 2003

(65) Prior Publication Data

US 2005/0151079 A1    Jul. 14, 2005

(30) Foreign Application Priority Data

Jun. 6, 2002    (IL) .................................. 150058

(51) Int. Cl.
*H01J 31/09* (2006.01)
(52) U.S. Cl. .................................... 250/332
(58) Field of Classification Search .............. 250/332, 250/370.08
See application file for complete search history.

(56) References Cited

U.S. PATENT DOCUMENTS

| | | | | |
|---|---|---|---|---|
| 5,811,808 A | * | 9/1998 | Cannata et al. | 250/332 |
| 6,147,340 A | * | 11/2000 | Levy | 250/214 R |
| 2005/0072923 A1 | * | 4/2005 | Elkind et al. | 250/332 |

OTHER PUBLICATIONS

Stuart Kleinfelder et al., "Focal plane array readout integrated circuit with per-pixel analog-to-digital and digital-to-analog conversion." Infrared Detectors and Focal Plane Arrays VI, Proceedings of SPIE vol. 4028 (2000) pp. 139-147.*

* cited by examiner

*Primary Examiner*—Albert Gagliardi

(57) ABSTRACT

A focal plane array detector in a sensor for IR imaging. Pixel readout and analog to digital conversion is performed in an integrated circuit which includes the imaging array. The charge of each pixel is accumulated in a capacitor (16) and a digital to analog charge converter cancels this charge. A controller controls this charge converter providing the appropriate amount of charge. An analog to digital converter incorporating a comparator (92) switches the controller on/off. In some embodiment a programmable device external to the sensor participates in the control of the analog to digital converter. In a typical embodiment of the invention a cycle generator controls the charge output of the digital to analog converter. In a preferred embodiment the analog to digital converters are grouped wherein all such converters group operate simultaneously.

21 Claims, 7 Drawing Sheets

FOCAL PLANE PROCESSOR FOR IR DETECTION

FIELD OF THE INVENTION

The present invention relates generally to IR focal plane array detectors. More specifically, the present invention is in the field of detector pixel signal readout and processing.

BACKGROUND OF THE INVENTION

Photonic detector devices respond to received photons by creating an electric effect which can be quantified and hence provide information as regards the flux of the received photons. Focal plane arrays (FPAs) of detectors are used to obtain images of objects, whereby each detector provides a pixel in is the image array. In the image, each pixel is provided with a unique address and a numeric value, which can further be used for manipulating the image for extracting information from the image.

Thermal Infra red (IR) FPAs are used for obtaining images in the thermal IR range. The resolution of an imaging array in the IR is limited by two factors, namely noise equivalent temperature (NET) and spatial noise, of the analog chain: the focal plane processor (FPP), the external analog circuitry and the analog to digital conversion. An external interference, such as RF interference or signals induced by the digital system may also degrade the performance. The temporal noise of the FPP can be reduced by careful design to be negligible relative to the signal noise, providing low NET values. Yet, to overcome the spatial noise, an external process of non uniformity correction (NUC) must be carried out. A "two point correction" process is generally used, assuming the analog chain to be linear and having stable offset and gain. The final results depend upon the validity of these assumptions, and the spatial resolution becomes a main restriction, limiting the dynamic range and requiring frequent calibrations. The FPP is kept at a steady temperature, e.g. at about 77° K while the external circuitry is exposed to wide temperature variations, degrading the gain and offset stability. Also, the FPP is relatively shielded against external interference, which is not the case with the external elements. In order to reach such a low temperature and keep it steady, the sensor is disposed within a cooled dewar. The dewar has electric connections installed in the walls, in order to facilitate electrical connection with external circuits.

Heat production is a matter of high importance in the design of FPPs. The efficiency of the cooling system being very low, the amount of power consumed by the circuits of the FPP at any time must also be limited. Sampling rates, sampling resolution, and output rates are factors which affect heat production. The use of components and combinations thereof having a low power consumption is favoured in the design of cooled FPPs. A trade-off between imaging parameters is a compromise often imposed for obtaining desirable image parameters. Accordingly, image frame rate at the expense of image resolution or image size are known in the art. Continuous attempts are made by various system designers to overcome the limitations described, striving to attain a high frame rate and a high resolution, with a reasonable power dissipation.

The value of the electric effect associated with each detector of the FPA is converted into a digital format, before it can be subjected to digital image processing. However, there are a number of critical reasons favouring conversion to digital format at an early stage as possible of the signal corresponding to each pixel. U.S. Pat. No. 5,886,659 discloses an on-focal plane analog to digital conversion application. Benefits of having the analog-to-digital conversion in the focal plane are discussed in that publication, the contents of which are incorporated herewith by reference.

Integrated converters have used several types of conversion schemes. Single-slope analog to digital conversion is a well-established technique. For example, U.S. Pat. No. 5,742,058 discloses an analog to digital conversion in the focal plane utilizing a single slope conversion cycle. The Dual-slope conversion provides better accuracy and stability (R. Van De Plassche, cited below). Yet, both techniques require quite long conversion times, being based on counters: the full-scale time of an n-bit single-slope converter is $2^n*Tc$, where Tc is the clock cycle time. The dual slope requires up to twice that time. The dual-ramp single-slope method, described by R. Van De Plassche in: INTEGRATED ANALOG TO DIGITAL AND DIGITAL TO ANALOG CONVERTERS, Kluwer Academic Press, pp. 274–289, 1994, the contents of which are incorporated herein by reference, promises both high resolution and reduced conversion time.

It is on the background hitherto described, that the present invention was conceived. The invention described below provides a basis for increasing the rate of sampling digitally at the FPP level, without compromising the resolution of each pixel.

DETAILED DESCRIPTION OF THE PRESENT INVENTION

Figure 1:
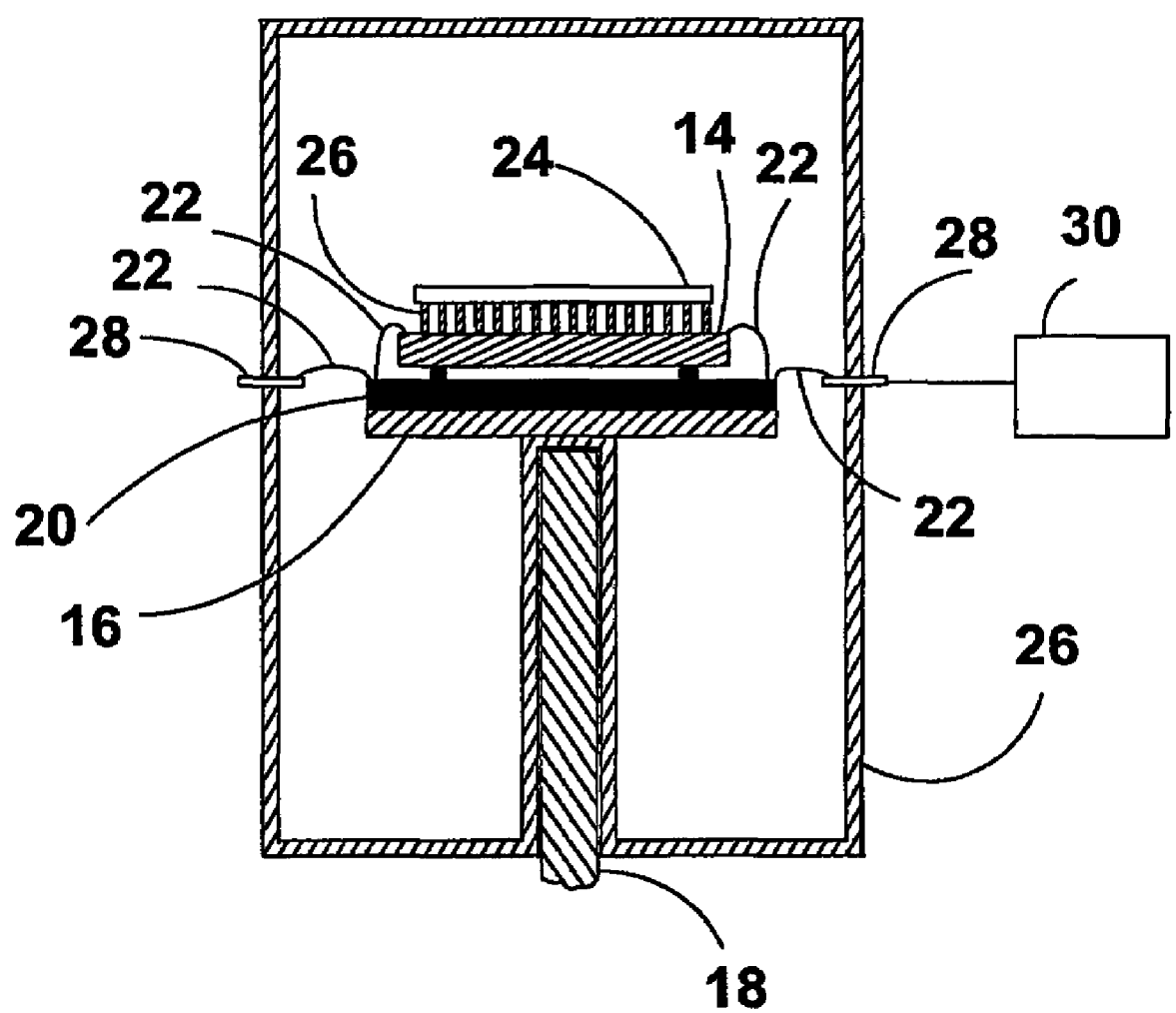
FIG. 1 is schematic description of the main structural features of an IR sensor system in which the invention is implemented.

A system of the invention is implemented in association with an integrated circuit device, a focal plane processor (FPP). The FPP is disposed within a cooled dewar, as described schematically in FIG. 1 to which reference is now made. A longitudinal cross section elevation in an IR sensor is shown, in which the FPP 14 of the invention is functional. Metal plate 16 is adjacent cold finger 18. The FPP is thermally connected while electrically isolated, with metal plate 16 through ceramic plate and spacers 20. To ceramic plate and spacers 20, which is electrically insulating, are connected wire bonds 22. FPP chip 14 supports detector array chip 24 through indium bumps 26, whereby for each detector in the detector array chip 24 there exists one bump connecting to the respective pixel in the FPP chip 14. Penetrating through the envelope of the dewar 26 are connecting pins 28. Wire bonds 22 connect pads (not shown) of FPP 14 to the appropriate connecting pins, having intermediate pads on the ceramic plate 20. The connecting pins provide electrical contact to external circuits 30.

Figure 2:
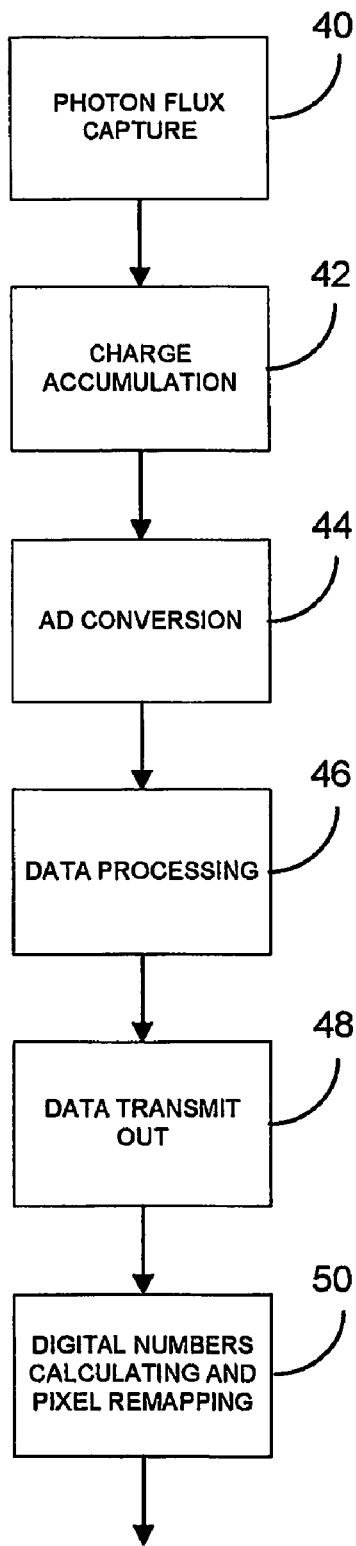
FIG. 2 is a flow chart describing schematically the process of the invention.

The process of the invention is summarized schematically in FIG. 2 to which reference is now made. In step 40, photon flux is captured on a detector pixel, causing a corresponding build-up of charge in the respective FPP pixel in step 42. In step 44 the charge in the FPP pixel is quantified digitally. In step 46 the results of the quantification are processed and in step 48 the processed data is transmitted to a programmable logic outside of the dewar for further processing. In step 50, digital numbers are calculated and pixels are remapped to restore the image.

FPP Pixel Charge Digital Conversion

Figure 3A:
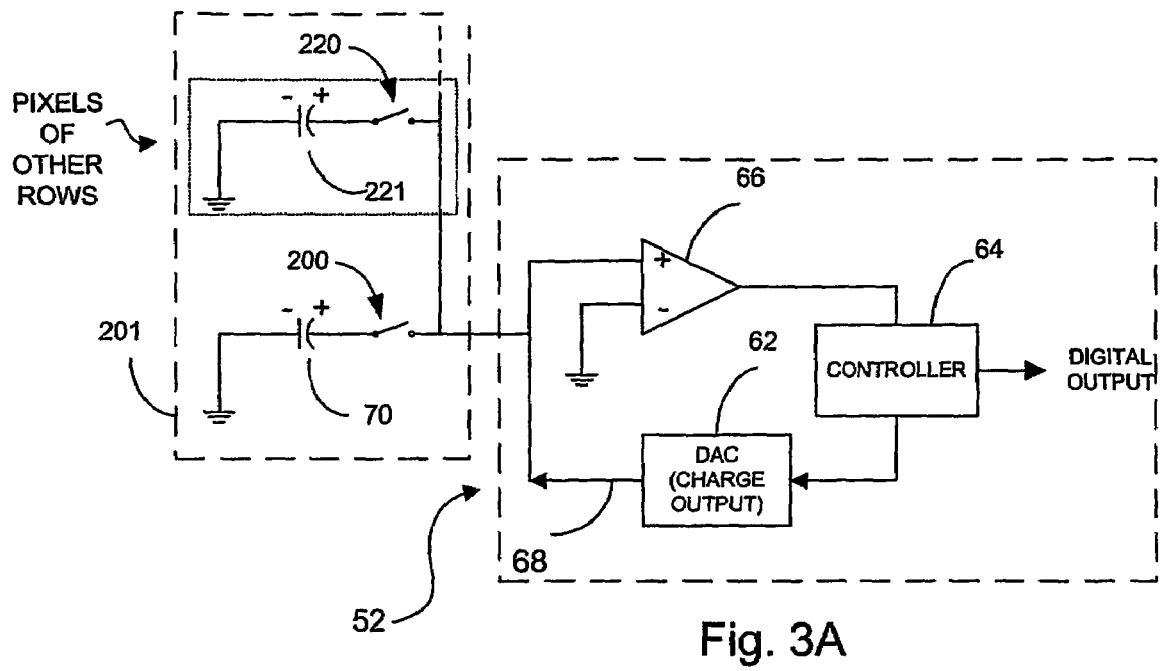
FIG. 3A is a circuit of the invention for converting the charge of a pixel.
Figure 3B:
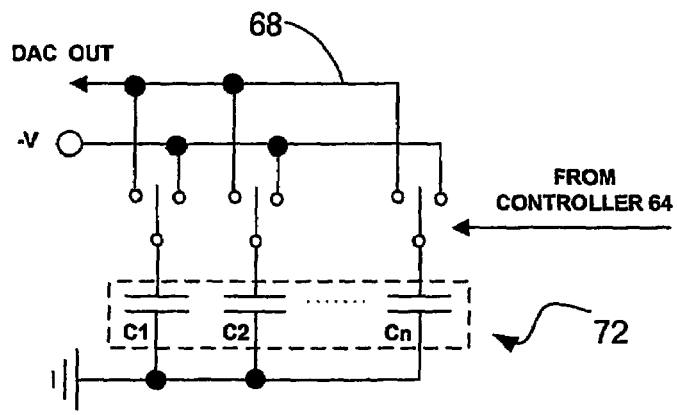
FIG. 3B Is a charge DAC optionally used in the system of the invention;.
Figure 3C:
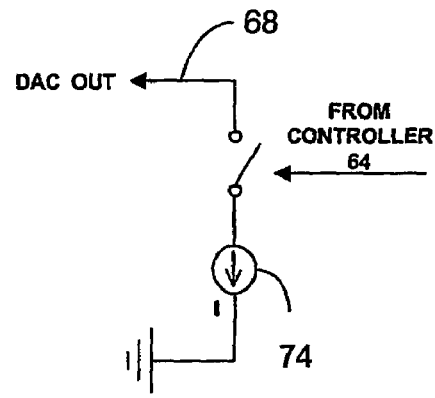
FIG. 3C is another charge DAC optionally used in the system of the invention.
Figure 3D:
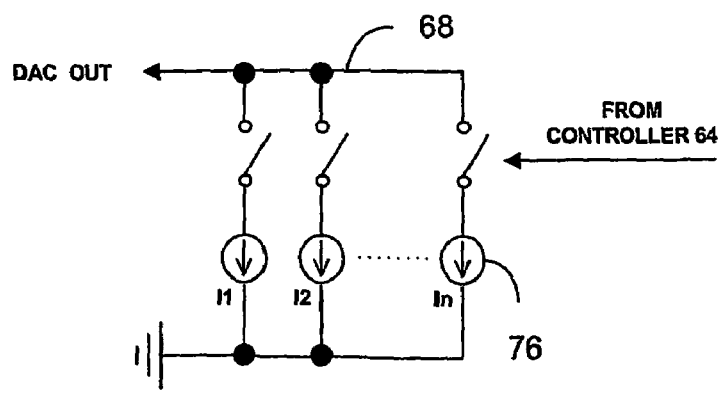
FIG. 3D is another charge DAC optionally used in the system of the invention, enabling multi step conversion.

The charge accumulated in the pixel In the FPP of the invention Is according to the present invention converted to a digital form by a circuit modified from Van De Plassche, cited above. The original circuit, known as a dual ramp single slope converter, samples the input voltage and then converts it into a digital number. The modified circuit of the present invention is a charge converter circuit, wherein the conversion is carried out directly on the pixel capacitor and no charge-to-voltage conversion and sampling are performed. The function of the circuit of the invention is described in reference to FIG. 3A. Peripheral block 52 contains a comparator 66, a charge output digital-to-analog converter (DAC) 62 and of controller 64. The input port of peripheral block 52 is line 68, which connects between the output port of the DAC 62 and comparator 66. Qpx, the charge to be converted, is stored in pixel capacitor 70. Closing switch 200 connects capacitor 70 to line 68 forming a charge ADC. DAC 62 produces a charge of opposite polarity, the value of which is controlled digitally by the controller 64. The digital control value (in bits) which eliminates Qpx (as indicated by the comparator 66 output) is the conversion output. No sampling of the input charge is required as the charge is eliminated directly on the pixel capacitor. On the next conversion, another pixel capacitor 221 is connected to the same peripheral block 52, forming a "new" ADC. The charge DAC of the invention can be implemented in several ways. Two exemplary implementations of such a charge DAC are described in FIGS. 3B and 3C to which reference is now made. In FIG. 3B a DAC implementation used in a successive approximation mode (wherein the capacitance ratios are 2:1) is described, in which the charge for elimination of the Qpx is provided by a set of capacitors 72 containing capacitors $C_1$–$C_n$, injecting charge doses. It Is also possible to use only the smallest capacitor, switching it many times and counting he number of switching necessary to eliminate the converted charge. The DAC of FIG. 3C is applicable in a charge conversion scheme. The charge supplied by the current source 74 Is determined by the duration of its connection to the DAC OUT port 68. The current source 74 is disconnected when the pixel capacitor charge is cancelled. The duration of the connection of source 74, is measured digitally, producing the conversion quantitatively. In a preferred embodiment of the invention, the total time of conversion is shortened using several (typically two) current sources as shown in FIG. 3D. The required charges are obtained by switching-on a sequence of current sources for a given time, producing charge packets accordingly. Source 76 is turned on first. Each consecutive current source turned on has a significantly reduced magnitude (typical ratios may be 16 or 32). The conversion is done accordingly in several steps, refining the resolution per step, as will be described later.

The "dual ramp single slope ADC" employs a quantification cycle which implements two steps. In the first step MS (most significant) part of the numeric value is determined, and in a second step, LS (least significant) part of the numeric value of the charge is determined. The two parts of the digital values of the measured quantity must be combined to form a complete digital word, as will be explained later on.

Figure 4A:
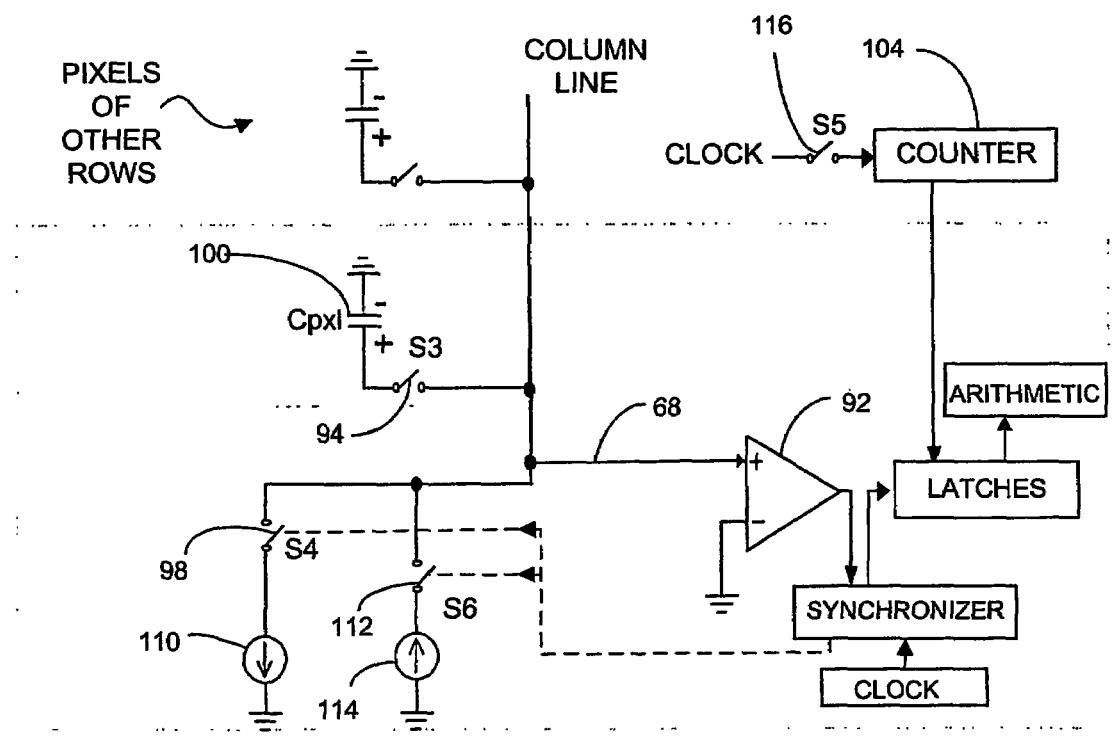
FIG. 4A is an implementation of a pixel charge converting circuit of the invention adapted for an array of pixels.
Figure 4B:
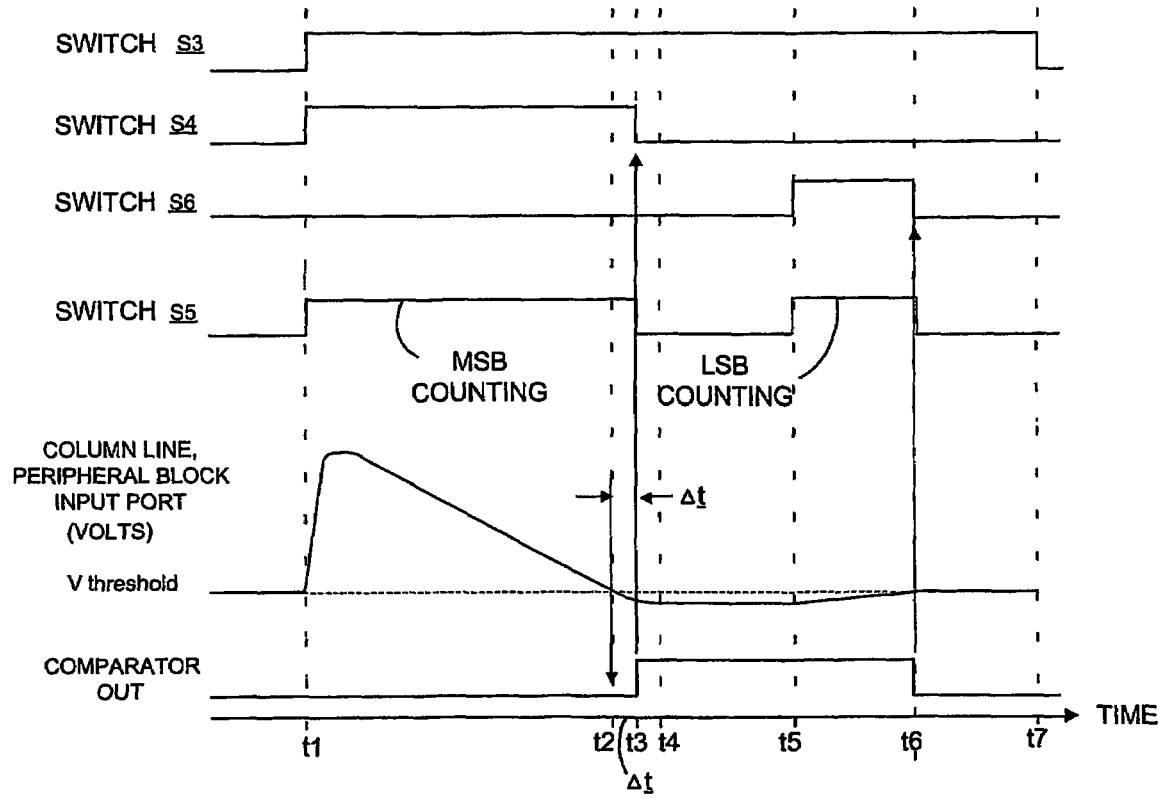
FIG. 4B is a graph describing the main wave-shape forms in the circuit of FIG. 4A in the course of one conversion cycle.

FIGS. 4A–B demonstrate an embodiment of the invention, implementing a two-step conversion: FIG. 4A shows the block diagram of the circuit, and FIG. 4B shows the main wave-forms during the conversion cycle. At time $t_1$ switches S3 94 and S4 98 are closed, connecting the pixel capacitor 100 and the current source 110 to the input 68 of comparator 92. Switch 94 remains closed throughout the conversion up to time $t_7$, while switch 98 opens when the pixel charge is eliminated, as indicated by the comparator. Since the output of the comparator is synchronized to the next clock pulse, switch 98 is opened at $t_3$ instead of $t_2$ and the voltage at the input 68 overshoots negatively, the residual voltage being proportional to $\Delta t=_3-t_2$. This overshoot will be eliminated in the next step: at time $t_5$ switch 86 112 is closed, connecting the current source 114, the magnitude of which is much smaller (e.g. 32 times) and the polarity is opposite to source 110 polarity. The charge is eliminated at time $t_6$, with the final residual error of the conversion. The period between $t_1$ to $t_4$ is the duration of the first step, which enables the conversion of the maximal pixel charge. The period between $t_5$ to $t_7$ is the duration of the second step for a maximal $\Delta t=t_3-t_2$. The clock is connected by switch S5 116 to the counter during two periods. First, from $t_1$ to $t_3$ for providing the "MSB count", and subsequently from $t_5$ to $t_6$ for providing is the "LSB count". The final count is achieve by subtracting the LSB counts from the MSB ones, while the relative weight of the two counts is determined according to the current ratio between the two current sources 110 and 114.

However, in practice, the pixels are arranged in the dense framework of a matrix of rows and columns which may be long such that certain Implications are inevitable trying to adapt a solitary pixel AD conversion application to a pixel array application, such as a column of the array. Accordingly, the following two concerns must be dealt with. The long column lines add mutual parasitic capacitances, the values of which may reach one order of magnitude larger then the pixel capacitor Cpx. Consequently, during the conversion, a cross-talk exists between adjacent column lines due to voltage transients, impairing the function of the matrix.

Figure 5:
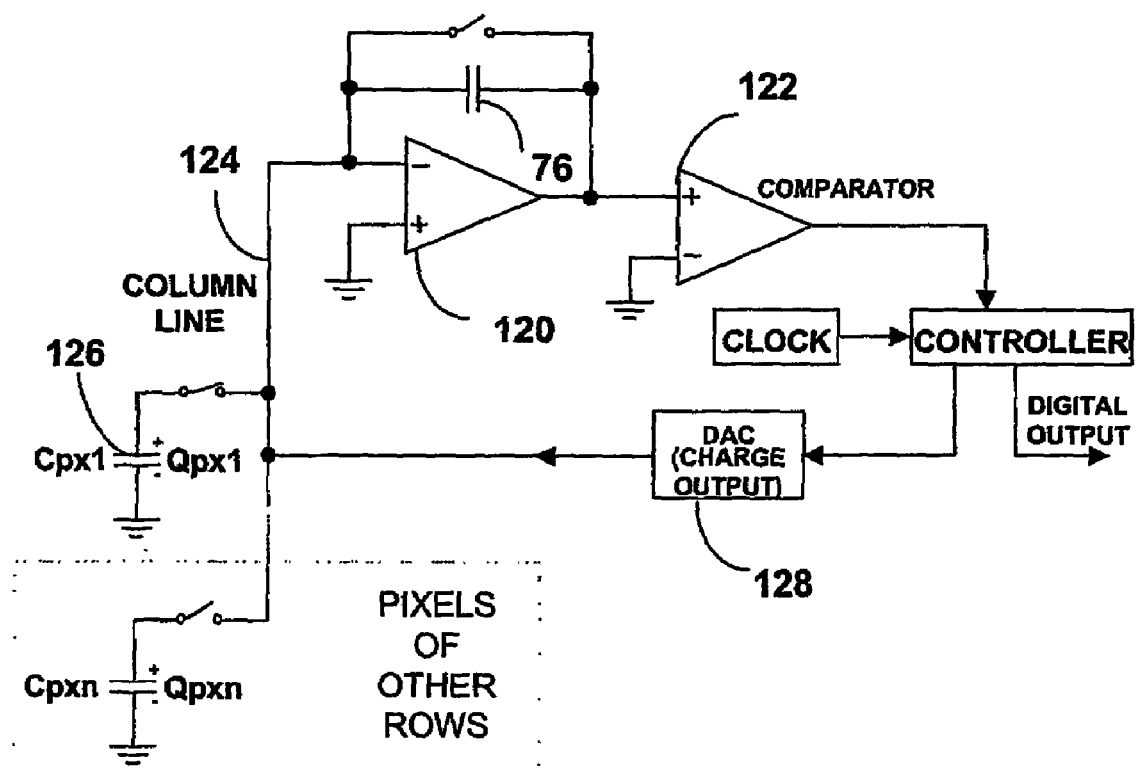
FIG. 5 is a charge converting circuit with an integrator added.

In accordance with one embodiment of the present Invention, an integrator, the input of which is a virtual ground, is added as a first stage of the comparator of the charge ADC circuit This architectural feature helps to overcome the above mentioned problem as the column line in this configuration becomes connected to a virtual ground. Such a configuration is described in FIG. 5 to which reference is now made. Integrator 120, is disposed between the comparator 122 and the column line 124, The charge to be converted is stored in the pixel capacitor 126, whereas the charge injected from DAC 128 into the column line 124, eliminates this charge as described above.

Figure 6A:
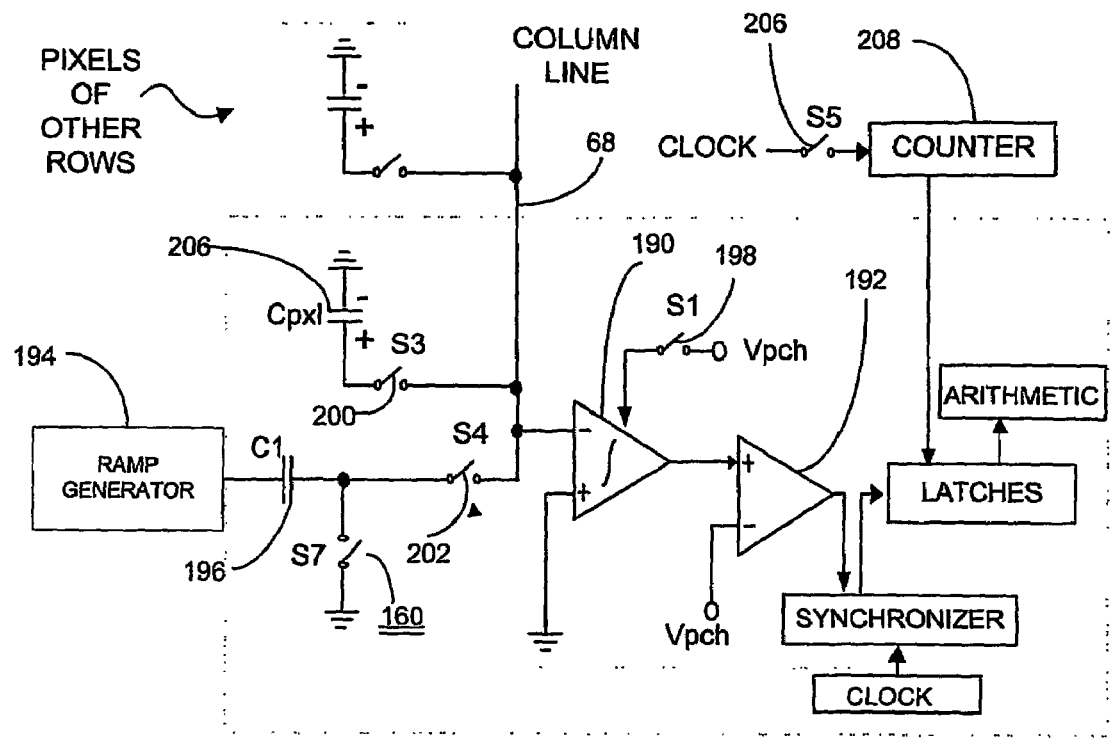
FIG. 6A is a description of detailed circuitry of the invention, wherein an integrator is added and the current sources are implemented by a dual ramp generator and a capacitor.
Figure 6B:
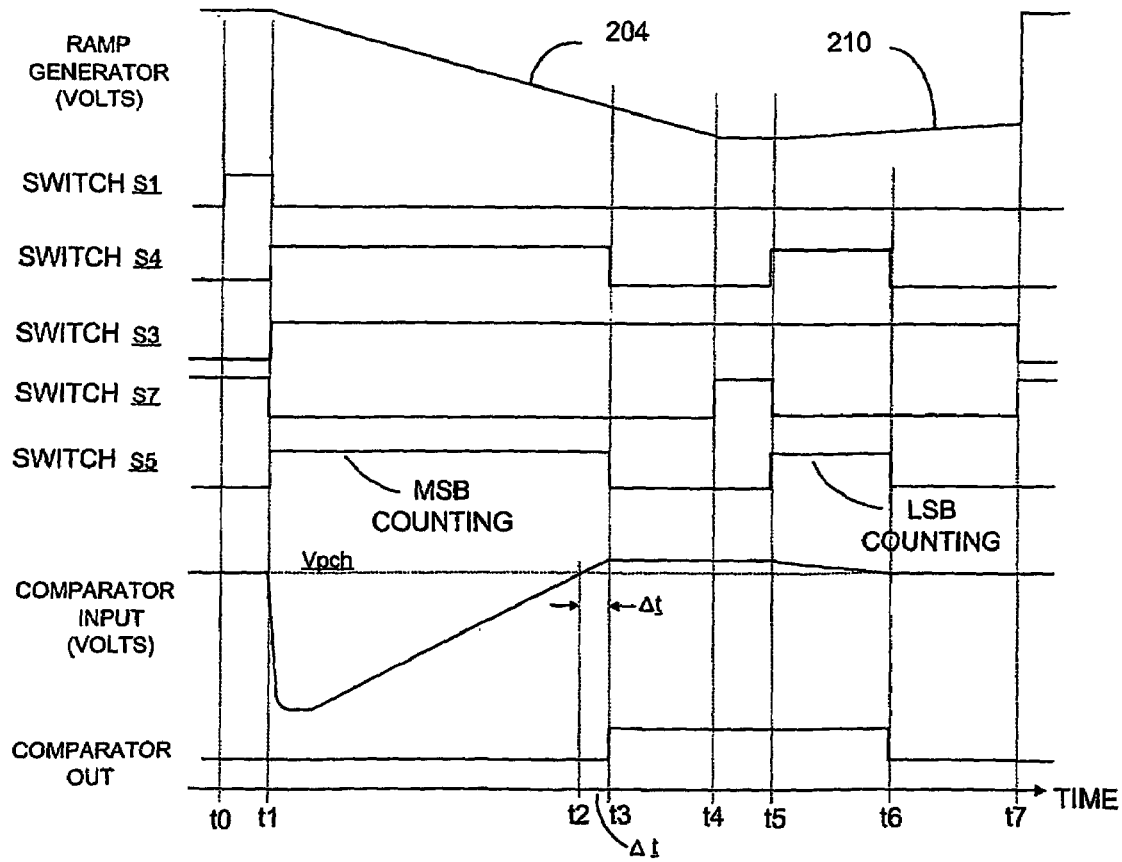
FIG. 6B is a description of the main wave-shape forms in the circuit of FIG. 6A, implemented in the course of one conversion cycle.

The two current sources 110 and 114 of FIG. 4A to which reference is again made, can be produced by a dual voltage ramp generator, driving a capacitor as will be described next. A configuration, combining the above mentioned integrator and the dulal ramp generator driving a capacitor is described in FIGS. 6A and 6B to which reference is now made. In FIG. 6A is shown an AD Conversion circuit in accordance with a preferred embodiment of the invention, the function of which is explained with reference to the conversion cycle and switching sequences described in FIG. 6B. In FIG. 6A Integrator 190, is disposed between the comparator 192 and the column line 68. The two above mentioned current sources are implemented by ramp generator 194 and capacitor C1 196. At time $t_0$ the quiescent output voltage of integrator 190, is forced by closing momentarily switch S1 198 to Vpch, (pre-charge voltage), which is also the reference voltage for comparator 192. Closing switches S3 200, S4 202 and S5 204 at time $t_1$, the conversion of the charge of a pixel, accumulated in capacitor Cpxl 206 begins. First, the output voltage of integrator 190 is lowered. Closing switch S4 202 at time $t_1$, a constant current source Is established by the combination of a linear ramp voltage (ramp 204 of FIG. 6B) and the capacitor C1 196, eliminating the measured charge while the integrator output goes up linearly. Switch 206 closes simultaneously with switch 202. Counter 208, which was reset earlier, starts counting the clock pulses. Reaching Vpch at time $t_2$, the integrator activates the comparator. The period $t_2 - t_1$ is a true indication of the signal to be measured. Yet, the output of the comparator is synchronized to the next clock, and only then, at $t_3$ it opens switch 202 and samples the counter reading (switch 206 remains closed until time $t_4$ in order to serve other ADCs). As a result, the output of the integrator continues to rise for a period $\Delta t$ (see FIG. 6B), so that the counter reading provides only the MS count, and a value, proportional to $\Delta t$ should be subtracted with higher resolution. This is done by writing the count (considered to be the MS bits) to latches, resetting counter 208 and closing again switch 206 and switch 202 at time $t_5$, which connects a second ramp (ramp 210 in FIG. 6B), the slope of which is positive and slower. The output of the integrator goes down and reaches Vpch at time $t_6$, disabling the comparator. The period between $t_1$ to $t_4$ is the duration of the first ramp, which enables the conversion of the maximal pixel charge. The period between $t_5$ to $t_7$ is the duration of the second ramp for a maximal $\Delta t$. Switch S7 160 must be closed whenever there is no ramp, in order to provide the initial conditions for capacitor C1 196. The counter reading Is sampled at time $t_6$, providing the LS count to be subtracted (with the proper weight) from the digital number represented by the former MS bits. The ratio between the absolute values of the slopes of the two ramps determines the number and weight of LS bits. The value of $\Delta t$ is nominally less then one clock time. Yet, In practice, due to delays in the comparator and the switching, it might reach as high as some clock times, the actual number of which depends also upon the clock frequency. Consequently, the period and the number of counter stages assigned to the second ramp is to be increased accordingly.

The combination of the common linear voltage ramps (204 and 210 in FIG. 6B) driving simultaneously the capacitors 196 (in FIG. 6A) in the peripheral blocks of all columns, enables applying low level DC current sources of approximately the same amplitude to all the ADCs. Thus the use of current mirrors, which are not accurate enough (especially in the nano-ampere levels), is avoided. The ramp generator 194 (in FIG. 6A) is basically an integrator, fed at each step of the conversion cycle by a constant current source of appropriate amplitude and polarity.

In order to decrease the readout time of a large matrix, two or more peripheral blocks can be implemented per column, provided that the number of column lines Is increased accordingly, wherein each column line connects part of the pixels of the column to a different peripheral block. All the peripheral blocks operate simultaneously, thus the charges of the pixels in two or more rows of the matrix are converted at a time.

In order to further decrease the conversion time without loosing resolution, the "dual ramp single slope AD Convertion" concept can be further extended into a multi ramp AD Convertion, where additional conversion steps, having successively decreased weights, are employed. This may be desirable In the case of very high resolution converters.

Programmable Logic Applications in the Present Invention

The FPP of the present invention is applicable to IR imagers in general. Yet, it is especially advantageous in cooled imagers, where the heat dissipated in the focal plane should be removed by cooling to a low and stable temperature. Therefore, architectural and functional considerations of the makeup of the integrated circuit have been made in order to decrease the power dissipation in the FPP integrated circuit. In accordance with one aspect of the invention, a programmable logic device, external to the dewar in which the Integrated circuit of the sensor is disposed, performs several tasks. The first one relates to the digital functions of the AD Conversions which are partially performed outside of the dewar. These functions being performed in the uncooled environment, serve to decrease the amount of components and heat dissipation in the FPP, therefore potentially improving the overall performance of the imager. As explained above, the digital value of each pixel is obtained in a MS part and an LS part. The two parts, after initial processing in the FPP, are finally combined to form one digital word In the external programmable logic device. The second task relates to the remapping of the pixels. The data transmission from the FPP to the programmable logic is optimized to minimize focal plane power dissipation. Consequently, the bits of a digital word transmitted from the dewar include a mixture of data from two pixels. Such mixed data is remapped in the external logic device, to restore the image.

Figure 7:
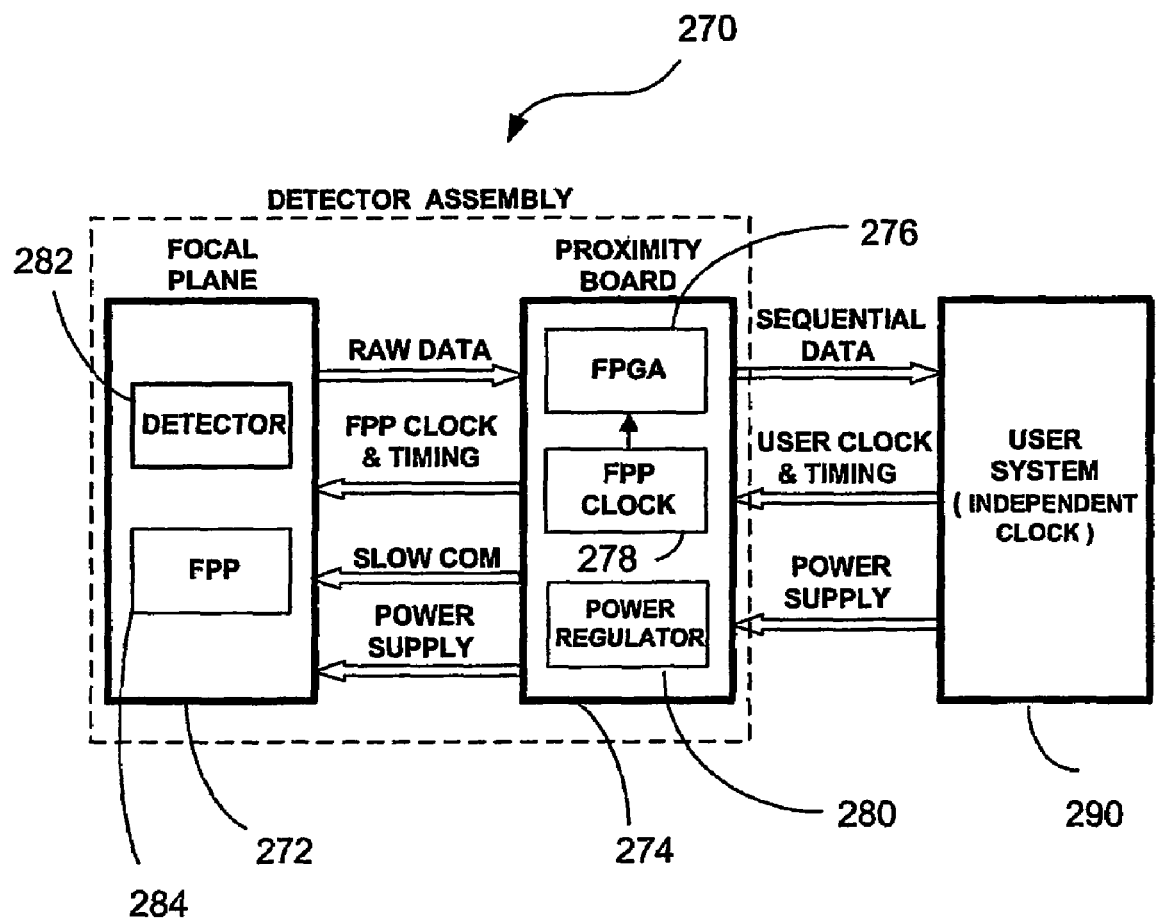
FIG. 7. is a schematic description of the interconnections existing between the main components of the imaging system, in accordance with the present invention.

The external programmable logic device also adds flexibility and optimizes the conversion cycle. Whereas the order of succession of the various conversion steps is fixed, the duration of each step is controlled externally. Thus, the duration of each step is set as required by the actual performance sequence, avoiding the need to reserve lengthy intervals of time for confidence margins. The data transfer associated with this aspect of the invention is described with reference to FIG. 7. The detector assembly 270, includes a focal plane module 272 and an external proximity board 274. The proximity board is a printed circuit board, placed close to the dewar pins, upon which the programmable logic such as FPGA (field programmable gate array) 276, a clock generator 278 and power supply regulation circuits 280 are mounted. In the focal plane module 272, the detector component 282 and the FPP 284 are included. The interconnections between the proximity board 274 and the focal plane module 272 are divided into four groups: regulated FPP power supplies bus, slow communications link, FPP clock and timing link and the raw data bus.

Through the conventional comparatively slow communication bus, various operation parameters of the FPP, which are not directly involved in the timing of the analog-to-digital conversion steps, are controlled, These include, inter alia, "integrate-then-read" (ITR) or "integrate-while-read" (IWR) modes of operation, working points, readout window size and location, etc. One parameter should be mentioned here, namely the resolution of the analog-to-digital conversion. The duration of a conversion cycle depends also on the resolution, increasing with the resolution. Some bits of the slow communication stream control the resolution, through the ratio between the slopes of the ramps 204 and 210 (in FIG. 6B), enabling a trade-off between the resolution and the frame-rate.

A faster link carries to the FPP the clock signal and the timing information of the conversion steps, mentioned earlier. In this fast channel, a stream of short pulses is sent on a wire from the external programmable logic to the FPP, where each pulse is recognized in the FPP as the start or end of a specific step. Programming the intervals between the pulses, the optimal conversion duration is determined. The raw data bus carries the partially processed data produced by the ADCs, from the FPP to be finally processed and remapped In the programmable logic device.

A different aspect of the imaging array which relates to the external programmable logic, is its exploitation as a user interface. Thus, in some embodiments of the invention, the programmable logic device can be used also as an interface to the external system 290 in FIG. 7, simplifying the users' interaction with the FPP. While the FPP of the invention operates with the optimal clock and timing for the conversion, the user can approach the buffered output on the programmable logic implementing specific communications protocol and clock. The clock of the user system is independent of the clock of the detector assembly, and does not have to be synchronized with it. The dialog between the two systems can then be established by an handshaking Implemented on the programmable logic device.

As described so far, the system of the invention is most beneficial in cooled FPPs, typically Implemented in thermal IR Imaging. It is nevertheless contended that the same system can be used in any FPP systems, for other imaging purposes, such as visible, near infra-red and X-ray. In such systems, heat dissipation in the FPP may be less critical, but the benefits of the system are still evident.

The invention claimed is:

1. A focal plane array containing rows and columns of pixels for IR imaging, wherein pixel readout and analog to digital conversion is performed in an integrated circuit inclusive of said array, comprising:
   at least one capacitor per pixel, accumulating the charge of a detector element;
   at least one peripheral block comprising a comparator for on/off switching a digital controller, wherein said controller controls a digital to analog charge converter for providing an appropriate amount of charge to cancel out the charge of one pixel at a time by said at least one peripheral block,
   switching elements for connecting said pixel capacitors to appropriate said peripheral blocks.

2. A focal plane array for IR imaging as in claim 1 comprising a cycle generator, for controlling a charge output of a digital to analog converter to cancel out said charge of said pixel.

3. A focal plane array for IR imaging as in claim 2 wherein said cycle generator is a ramp generator connected through a capacitor to the input port of at least one of said peripheral blocks and to a column line.

4. A focal plane array for IR imaging as in claim 3 wherein said ramp generator produces at least one linear ramp.

5. A focal plane array for IR imaging as in claim 1 wherein said comparator includes an integrator as an input stage.

6. A focal plane array for IR imaging as in claim 1 and wherein said focal plane array is cooled.

7. A focal plane array for IR imaging as in claim 1 wherein a plurality of said peripheral blocks are grouped in groups, and wherein all said peripheral blocks belonging to one group operate simultaneously.

8. A focal plane array for IR imaging as in claim 7 and wherein each of said groups contains at least two of said peripheral blocks per each column.

9. A focal plane array for IR imaging as in claim 7 and wherein one multi ramp generator serves at least one group of said peripheral blocks.

10. A focal plane array for IR imaging as in claim 7 and wherein one counter serves at least one group of said peripheral blocks.

11. An IR imaging system as in claim 1 and wherein an external programmable logic device connected via a communication channel participates at least in the control of said peripheral blocks.

12. An IR imaging system as in claim 11 wherein said external programmable logic device also contains a buffer, for providing an interface between the readout stream and the timing parameters and communications protocols of a user.

13. A method for digitally quantifying IR radiation impinging on a focal plane array, wherein the charge accumulated in each pixel is simultaneously readout and analog to digital converted, employing at least one said peripheral block for each column of said array, and wherein a digital to analog charge converter is controlled by a comparator to supply a charge in an appropriate quantity to cancel out said charge of said pixel.

14. A method for digitally quantifying IR radiation impinging on a focal plane array as in claim 13 and wherein a cycle generated contains at least one ramp.

15. A method for digitally quantifying IR radiation impinging on a focal plane array as in claim 13 wherein an analog to digital conversion of the charge in every pixel is done on the focal plane in two quantification steps, a first step providing the most significant bits and a second step the least significant bits of said quantification.

16. A method as in claim 15 wherein a dual ramp generator generates a dual step charge cancellation of said pixel charge, providing a most significant count in a first step and a least significant count in a second step.

17. A method for digitally quantifying IR radiation impinging on a focal plane array as in claim 15 and wherein the combination of the most significant bits and the least significant bits into one digital number is done partially externally, outside of said focal plane array.

18. A method for digitally quantifying IR radiation impinging on a focal plane array as in claim 16, and wherein a tradeoff between the resolution of said quantification and the frame rate is enabled by programming said dual ramp conversion cycle.

19. A method for digitally quantifying IR radiation impinging on a focal plane array as in claim 13, and wherein the pixels of said array are grouped in rows, such that quantification is performed simultaneously for all members of said group, each group at a time, allocating at one conversion time one said peripheral block to each member of a group.

20. A method for digitally quantifying IR radiation impinging on a focal plane array as in claim 19, and wherein for said each group of pixels, one common ramp generator produces at least one linear voltage ramp whereby in each said peripheral block a low level DC current is created by said ramp driving a capacitor connected to the junction of the pixel capacitor and input of said peripheral block.

21. A method for digitally quantifying IR radiation impinging on a focal plane array as in claim 19, and wherein each of said groups contain two rows of said array.

* * * * *